United States Patent [19]

Miller et al.

[11] Patent Number: 5,376,229
[45] Date of Patent: Dec. 27, 1994

[54] METHOD OF FABRICATION OF ADJACENT COPLANAR SEMICONDUCTOR DEVICES

[76] Inventors: Jeffrey N. Miller, 26699 Snell La., Los Altos Hills, Calif. 94022; Steven D. Lester, 2162 Staunton Ct., Palo Alto, Calif. 94306; Danny E. Mars, 1960 Churton Ave., Los Altos, Calif. 94024

[21] Appl. No.: 131,835

[22] Filed: Oct. 5, 1993

[51] Int. Cl.$^5$ ................. H01L 21/306; B44C 1/22
[52] U.S. Cl. ..................... 156/651; 156/655; 156/659.1; 156/662; 437/78; 437/203
[58] Field of Search ............ 156/630, 633, 646, 647, 156/648, 649, 650, 651, 655, 659.1, 662; 437/77, 78, 203

[56] References Cited

U.S. PATENT DOCUMENTS

| | | | |
|---|---|---|---|
| 4,837,178 | 6/1989 | Ohshima et al. | 437/78 X |
| 4,846,931 | 7/1989 | Gmitter et al. | 156/633 |
| 4,908,328 | 3/1990 | Hu et al. | 437/78 X |

OTHER PUBLICATIONS

S. Hiyamizu et al., Lateral Definition of Monocrystalline GaAs Prepared by Molecular Beam Epitaxy, Jul. 1980, Journal Electrochem. Soc., pp. 1562–1567.
A. Y. Cho et al., GaAs planar technology by molecular beam epitaxy (MBE), vol. 46, No. 2, Feb. 1975, Journal of Applied Physics, pp. 783–785.

*Primary Examiner*—William Powell

[57] ABSTRACT

A method for processing coplanar semiconductor devices of different types as provided. The method includes the steps of: forming a first layer for formation of a first device region on a substrate, forming an epitaxial semiconductor lift-off layer above the first device region, removing a portion of the first device region to open areas for the formation of the second device region, depositing epitaxially a second device region, and removing the liftoff layer to leave the first and second device regions remaining on the substrate.

13 Claims, 3 Drawing Sheets

METHOD OF FABRICATION OF ADJACENT COPLANAR SEMICONDUCTOR DEVICES

BACKGROUND OF THE INVENTION

Field of Invention

The present invention relates to the field of semiconductor devices and their method of manufacture. More specifically, the invention provides an improved method of forming adjacent coplanar semiconductor devices, where the coplanar semiconductor devices require different semiconductor materials or different process steps for formation.

Description of the Prior Art

The earliest manufacturing processes for integrated circuit devices provided multiple identical devices formed on a single substrate using a single process sequence. In some cases it is desirable to form different devices on a single substrate. When forming different device structures on a single substrate, it is common to form device regions or islands within which different device structures are formed. Each device region or island is used for formation of different active or passive devices. The article *Selective molecular-beam epitaxy for integrated npn/pnp heterojunction bipolar transistor applications*, by Streit et al., J. Vac. Sci. Technology, Mar./Apr 1992, pages 1020–1022. shows the formation of two different device islands (a pnp island and an npn island) adjacent to each other. The pnp and npn device regions or islands act are used for formation of pnp and npn bipolar device structures.

FIG. 1 illustrates a fabrication sequence for the formation of two different device regions on a GaAs substrate. The term "different device regions" refers to formation of regions using different materials or process sequences. For example, although in the embodiment shown in FIG. 1 both devices regions are formed from the same semiconductor material (gallium arsenide) they have different dopant concentrations. Alternatively, the device regions could be formed using different materials. For example, the first device region could be comprised of gallium arsenide while the second device region is comprised of the group III-V alloy aluminum gallium arsenide. Further, the device regions can be comprised of a plurality of layers of different semiconductor materials.

FIG. 1A shows the resultant structure after formation of the active region of the first device type 102 on a gallium arsenide substrate 104, deposition of a dielectric layer 106, and patterning a well region 108 to define the active region of a second device structure. As shown in FIG. 1B, after formation of the well region 108, a layer of gallium arsenide 110 is deposited to form the active region of the second device. Although the gallium arsenide 110a deposited in well region 108 is monocrystalline, the gallium arsenide 110b grown on the surface of the dielectric 106 is polycrystalline.

The formation of a rough polycrystalline surface resulting from the growth of GaAs over a dielectric is well known. The articles *GaAs planar technology by molecular beam epitaxy (MBE)*, A. Y. Cho, Journal of Applied Physics, Vol. 46, No. 2, February 1975, pgs. 783–785, and *Lateral Definition of Monocrystalline GaAs Prepared by Molecular Beam Epitaxy*, S. Hiyamizu et al., J. Electrochem. Soc.: Solid-State Science and Technology, July 1980, pgs. 1562–1567, both describe the growth of polycrystalline GaAs over an oxide region and monocrystalline GaAs growth over the opening of the GaAs substrate.

The formation of polycrystalline GaAs creates problems in the later formation of the second device region. First, the polycrystalline GaAs 110b forms a rough surface which decreases alignment accuracy in future masking steps. Another problem associated with the formation of polycrystalline GaAs 110b is the formation of dendrites 112 or whisker growth extending from the side of the polycrystalline GaAs layer 110b over the second device region 110a. Whisker growth can nucleate on the dielectric layer 106 and has been observed to extend out as much as 10 microns over the single-crystal window areas of the second device type thereby shadowing growth. The whisker growth makes it impossible to grow good quality GaAs near the interface between the first and second device regions 102, 110a making the area near the interface unusable. Further, adatom migration off of the dielectric into the active region of the second device has been observed, resulting in nonuniform composition or thickness near the sidewall of the well region. In addition, the shadowing effect of the whisker growth results in uneven thickness of the second GaAs deposition 110a near the interface between the first and second device regions.

After deposition of the gallium arsenide layer 110, the dielectric layer 106 and the polycrystalline GaAs layer 110b are removed to leave two coplanar device regions, Attempts to remove the polycrystalline GaAs layer 110b and the dielectric layer 106 by applying an etchant to the dielectric layer 106 have proved unreliable. The most reliable method for removing the polycrystalline GaAs layer 110b is by the remasking process illustrated in FIGS. 1C and 1D. Although remasking can be used to form adjacent coplanar device regions, there are problems associated with the remasking process, First, the remasking process adds additional steps to the device formation process including an alignment step which increases process complexity. Further, the remasking process increases the unusable portion of layer 110a near the interface between the first and second device regions.

Referring to FIG. 1C, a layer of photoresist is applied and alter alignment exposed to provide a mask 116 to protect the second device region 110a. Because of the whisker growth 112 formation extending over the second device region 110a, the mask 116 needed to remove the polycrystalline GaAs 110b is smaller in size than the mask used to form the well region of the second device. Thus a new mask is needed, increasing process costs. An etchant is applied to remove the polycrystalline GaAs 110b and the dielectric layer 106 in regions not protected by the mask 116. After the etch is complete, the first and second device regions 102, 110a remain as shown in FIG. 1D. However, because the mask 116 is decreased in size because of the polycrystalline dendrite 112 formation, there are unusable regions near the interface between the first and second device regions.

An improved method for formation of adjacent coplanar semiconductor devices which decreases process complexity and minimizes the unusable semiconductor regions near the interface between the two device types is needed.

SUMMARY OF THE INVENTION

A method for processing coplanar semiconductor device regions is provided. The method includes the steps of: forming a first layer for formation of a first device region on a substrate, forming an epitaxial semiconductor lift-off layer above the first device region, removing a portion of the first device region to open areas for the formation of a second device region, depositing epitaxially the second device region, and removing the liftoff layer to leave the first and second device regions remaining on the substrate.

In a first embodiment, the first device region is formed by molecular beam epitaxy deposition of GaAs in an epitaxial chamber. After formation of the first device region, a lift-off layer is formed on top of the surface of the first device region without removal of the wafer from the epitaxial chamber. In the preferred embodiment, the liftoff layer is comprised of a first layer having a high selective etch rate and a second protective layer. The first layer is typically $Al_xGa_{1-x}As$ with (x>0.6) or AlGa and the second protective layer is typically GaAs. Both AlGaAs and GaAs are single crystal epitaxial semiconductors that can be grown in tile same apparatus as the first device region without exposure to air. This differs from the prior art which makes use of amorphous polycrystalline films deposited in processing equipment away from the main growth apparatus. Deposition of both the first device region and lift-off layers in a single epitaxial chamber eliminate process steps corresponding to water transfer between processing equipment which is necessary in the prior art.

After lift-off layer formation, a well is then etched through the lift-off layer and the first device layer. The depth of the etched well is chosen so that the first and second device regions will be coplanar. A second layer is then deposited in an epitaxial chamber Brining the second device region in the etched well. This material will grow in the etched well and also on top of the lift-off layers above the first device region.

In the present invention, the material not necessary for formation of the first and second device regions is "lifted off" by taking advantage of the high selective etch rate of the first layer of lift-off layer. The first layer of the lift-off layer is comprised of a single semiconductor layer that can be etched selectively with respect to all the other layers. In the preferred embodiment, the lift-off layer is typically $Al_xGa_{1-x}As$ with x greater than or equal to 0.6. The etchant used is typically HF or dilute HF. The high etch selectivity allows for the clean removal of the lift-off layer leaving only the first and second device regions on the semiconductor substrate. This leaves behind a planar integration of the first device region and the second device region.

A second embodiment uses the same basic processing sequence as the first embodiment. However, instead of a lift-off layer comprised of two different epitaxially deposited layers, the lift-off layer is comprised of a series of three separate epitaxially deposited layers. The first lift-off layer has a high selective etch rate and is easily etched away to achieve the lift-off of the layers above the first device regions. The second lift-off layer is a contour layer that is contoured during etching so that it shadows the sidewalls of the etched well during growth of the second device region. The shadowing of the sidewalls of the etched well improves the reliability and yield of the lift-off process. The third lift-off layer is a capping or protective layer, typically GaAs. The protective layer is used to insure that a clean, oxide-free single crystal surface is available on the surface of the lift-off layer. The clean oxide-tree surface promotes high quality crystal growth on the surface of the lift-off structure so that high quality crystal growth is initiated during the growth of the second device region.

The embodiment disclosed in the present invention provides an alternative to the remasking procedure taught in the prior art. The present invention simplifies the process for formation of adjacent coplanar devices by eliminating the alignment step necessary for remasking. Eliminating the alignment step decreases process complexity and device size. Further, the smooth monocrystalline surface provided by the present invention facilitates alignment compared to alignment on a rough polycrystalline surface.

In addition, the process described in the present invention eliminates the formation of polycrystalline material, and dendrites or whisker growth nucleating on the dielectric layer and extending out over the single-crystal window areas. Because no rough polycrystalline material or dendrites occur, the unusable gallium arsenide near the interface between the first and second devices is greatly reduced. Minimal shadowing occurs, thus the uniformity of the deposited gallium arsenide layer is improved. Further, adatom migration is reduced resulting in improved uniformity of composition and dopant concentration near the interface between the first and second devices.

A further understanding of the nature and advantages of the invention may be realized by reference to the remaining portions of the specification and the attached drawings.

DETAILED DESCRIPTION OF THE INVENTION

The present invention provides a method of formation of coplanar device regions. The method includes the steps of: depositing epitaxially a first layer on a substrate for formation of a first device region, depositing epitaxially a lift-off layer above the first device region, removing a portion of the first region to open areas for formation of a second device region, depositing epitaxially a second device region, and removing the lift-off layer to leave a first and second device region remaining on the substrate.

FIGS. 2A–2D illustrate the fabrication sequence for the formation of adjacent coplanar device regions according to one embodiment of the present invention. Group III-V compounds are typically used as the substrate for the coplanar device regions. The first step for formation of the coplanar device regions is formation of a first layer on the substrate, where the first layer is used for formation of a first device region. The first layer is typically formed by depositing epitaxially a layer of GaAs in a reaction chamber. Although the embodiment described with reference to FIG. 2 uses GaAs, other semiconductor materials can also be used.

Formed within the first and second device region are active and passive device structures. Although the simplest embodiment would be a first or second device region comprised solely of gallium arsenide, the first and second device region may be comprised of a plurality of sublayers composed of different III-V semiconductor materials as needed to form the desired device structures. Alternatively, only a portion of the first device region may be comprised of a plurality of sublayers of different III-V semiconductor materials.

After formation of the first layer 204, a lift-off layer 206 is formed on top of the GaAs first layer 204. In one embodiment, the lift-off layer 206 is comprised of a first etch layer 206a having a high selective etch rate and a second protective layer 206b. In the preferred embodiment, the first etch layer 206a is AlAs formed by deposition of a thin layer of AlAs by molecular beam epitaxy. The AlAs lift-off layer 206a can be as thin as 20 angstroms or as thick as 2 microns, however, the AlAs lift-off layer 206a is typically in the range of 50 to 500 angstroms. Although, AlAs is preferred, AlGaAs or any lift-off layer having a high etch rate compared to the substrate can be used. The etch rate differential between the liftoff layer and the device region should be at least as high as $10^5$.

Figure 1A:
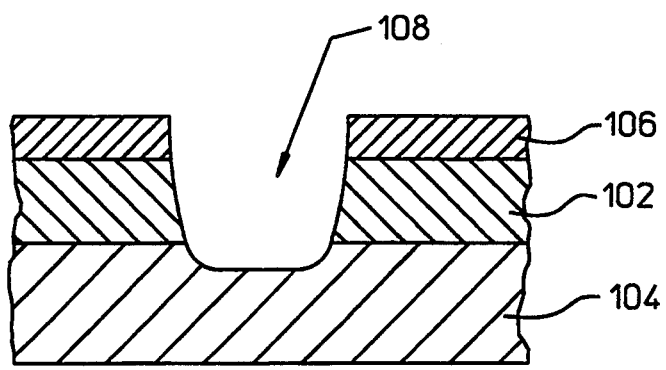
FIGS. 1A–1D illustrate a prior art method of fabrication of coplanar devices.
Figure 1B:
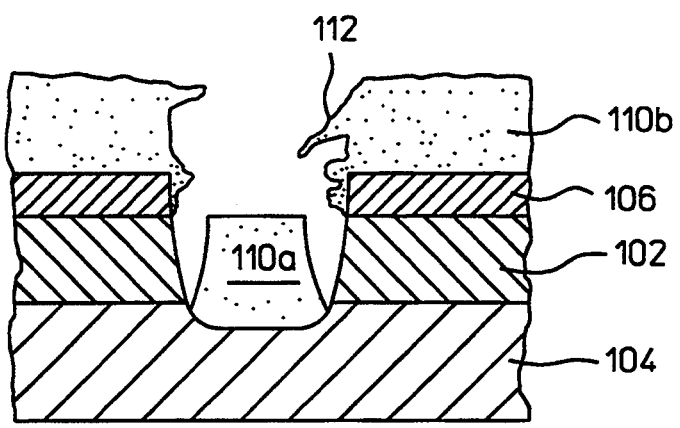
Figure 1C:
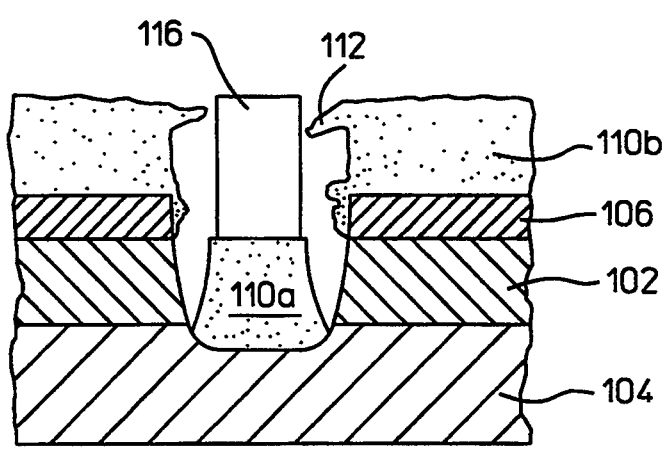
Figure 1D:
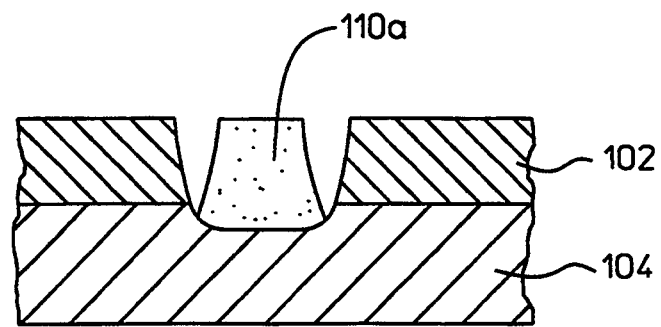
Figure 2A:
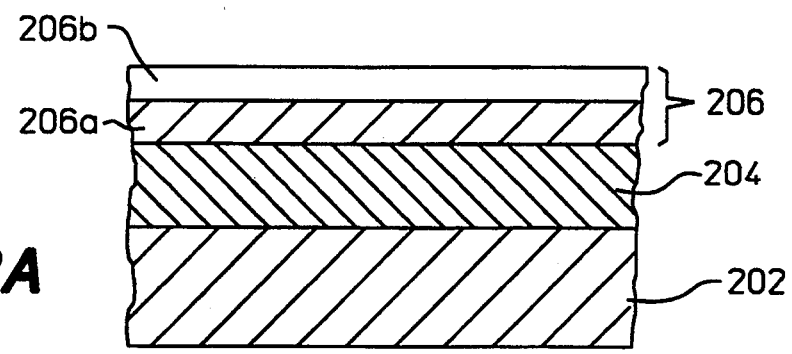
FIGS. 2A–2D illustrate the fabrication of coplanar device structures according to a first embodiment of the present invention.

After formation of the AlAs first layer 206a, a second protective layer 206b is deposited on the first layer 206a as can be seen in FIG. 2A. Typically, the protective layer 206b is comprised of GaAs and is formed by depositing GaAs epitaxially to a height of approximately 500 angstroms. The second GaAs layer 206b is used to protect the first AlAs layer 206a from oxidation and is typically thicker than the AlAs first layer 206b.

Although the formation of a protective layer 206b is preferred, the protective second layer 206b is not essential. A single lift-off layer 206a comprised of a material having a high etch rate compared to the etch rate of the substrate would be sufficient to form the coplanar device regions according to the described process. However, since AlAs and AlGaAs are prone to oxidation a protective layer is preferred if either is used as the lift-off layer.

FIG. 2A shows the GaAs substrate 202 after formation of the first device region 204 and the lift-off layer 206. Because the first layer 204, and the lift-off layers 206a and 206b are all grown sequentially, they may be formed in the same epitaxial growth apparatus. Growing the first layer and the lift-off layers in the same epitaxial growth apparatus prevents exposure of the device to air and decreases device defects. Further, deposition of both the first device region and lift-off layers in a single epitaxial chamber, eliminate process steps corresponding to wafer transfer between processing equipment.

Figure 2B:
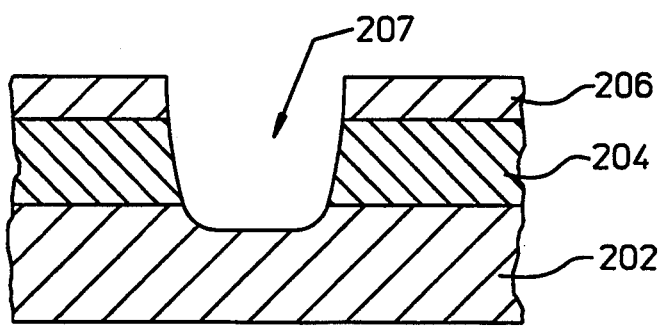

After deposition of the first device layer 204 and the lift-off layer 206, a well region 207 which defines the area for later formation of the second device region is defined using patterning techniques well known to one skilled in the art. FIG. 2B shows the resultant structure after formation of the well region 207. Typically the well region 207 is defined by depositing a layer of photoresist, exposing and developing the photoresist to form a mask defining the well regions of the second device, and etching to provide the well regions of the second device. The etchant used to form well region 207 is typically aqueous anisotropic non-selective etchant comprised of $NH_4OH$, $H_2O$ and $H_2O_2$. The etchant provides a smooth, clean surface for future regrowth.

Figure 2C:
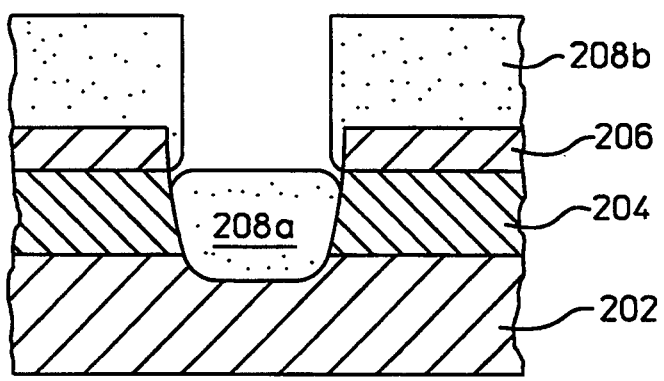
Figure 2D:
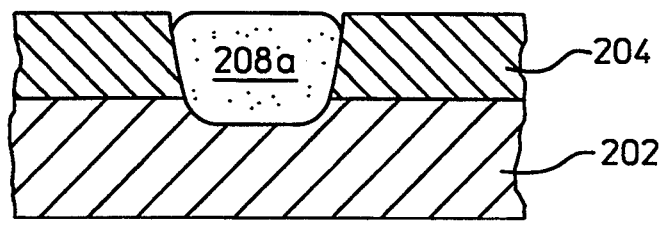

After the well regions 207 are defined, a gallium arsenide layer 208 is formed resulting in the structure shown in FIG. 2C. The gallium arsenide deposited in the etched well region 207 forms monocrystalline gallium arsenide 208a. The GaAs layer 208a layer forms the second device region. The gallium arsenide deposited over the protective layer 206b also forms monocrystalline gallium arsenide 208b.

After deposition of the device type 208, the material above the first and second device regions 204, 208a are removed to leave the first and second device regions 204, 208a remaining on the substrate. Referring to FIG. 2C, the structures above the first and second device regions 204, 208a include the lift-off layer 206 and the gallium arsenide layer 208b. The lift-off layer 206 and the gallium arsenide layer 208b are typically removed by exposing the structure shown in FIG. 2C to an etchant which attacks the first layer 206a of the lift-off layer 206. Typically the etchant used to dissolve the AlAs first layer 206a is an aqueous HF etchant solution having a 5-50% HF acid concentration.

The lift-off layer can be any material having a high selectivity compared to the substrate. U.S. Pat. No. 4,846,931 to Ginitier et al. discusses the uses of an AlAs release layer in combined with a support layer to cause the edges of the AlAs release layer to curl upward causing improved outdiffusion of reaction products. According to U.S. Pat. No. 4,846,931 to Gmitter et al., the selectivity of AlAs with respect to an HF etchant is greater than 107 with respect to a <100> oriented substrate. Thus Applicant believes that AlAs lift-off layer 206a is etched at greater than 107 times as fast as any of the other layers in the structure. As a result, the lift-off layer is completely dissolved away in tile HF solution while etching of the substrate is neglible. This allows layers 206 and 208b to float off in the etchant solution leaving the structure shown in FIG. 2D.

Selective etching using an HF etchant solution is improved when the etchant is purged of oxygen. This can be achieved by storing the etchant solution in an N, ambient for more than one day. Providing an acid solution purged of oxygen results in neglible etching of the first and second device regions.

Figure 3A:
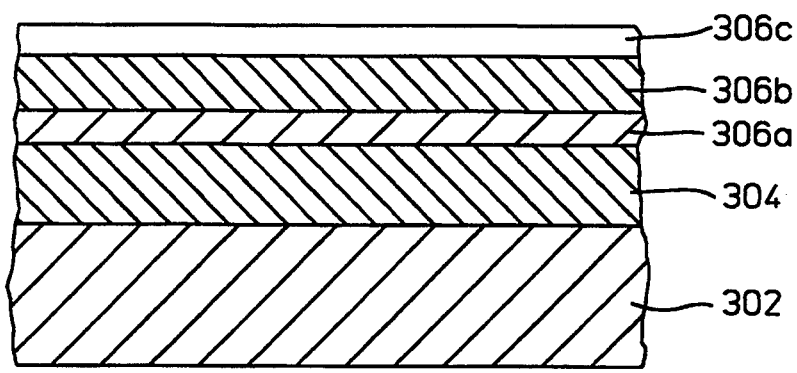
FIGS. 3A–3D illustrate the fabrication of coplanar device structures according to an alternative embodiment of the present invention.
Figure 3B:
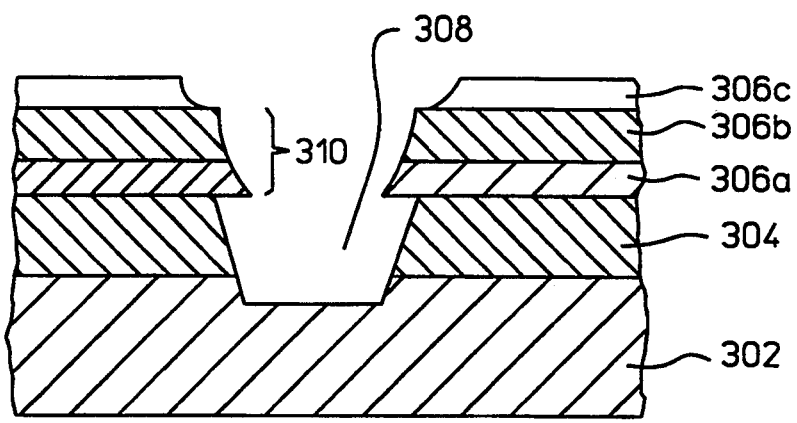

FIGS. 3A-3D illustrate the fabrication sequence for the formation of adjacent coplanar device regions according to a second preferred embodiment of the present invention. FIG. 3A shows a GaAs substrate 302 after formation of the first device region 304 and the lift-off layer 306. The processing sequence for the second embodiment is similar to the processing sequence for tile first embodiment. However, instead of a lift-off layer comprised of two different epitaxially deposited layers, the liftoff layer 306 is composed of three separately epitaxially deposited layers. Similar to the first embodiment, the lift-off layer is deposited sequentially in the same epitaxial growth chamber as the first device layer 304.

In the embodiment shown in FIG. 3A, tile lift-off layer 306 is comprised of three layers: a first layer 306a having a high etch rate, a second conformal layer 306b, and a third protective layer 306c. The first layer 306a is typically comprised of AlAs or alternatively $Al_x$-$Ga_{1-x}As$ where x is greater than or equal to 0.6. The second con formal layer 306b is typically comprised of AlGaAs and is formed by deposition of AlGaAs by molecular beam epitaxy. The AlGaAs layer 306b typically has a height in the range of 0.5 to 1.0 $\mu$m. The protective layer 306c is typically comprised of GaAs and is formed by deposition of GaAs by molecular beam epitaxy. The GaAs layer 306c is approximately 500 angstroms in height and serves the same purpose as the protective layer 206b described with reference to FIG.

2. As described in the first embodiment, layer 306c may not be essential.

After the formation of the lift-off layer 306, the well region 308 for the second device is defined. The well 308 for the active region of the second device is defined using processing techniques well known to one skilled in the art. Typically the well region 308 of the second device is defined by a process including the steps: of depositing a layer of photoresist, exposing and developing the photoresist to form a mask defining the well region of the second device, and etching to form tile well region of the second device.

In the second embodiment, a sequence of two etches is used to form the well region 308. Additionally, the etch sequence is used to form an overhang region 310 which extends past the sidewalls of the active region of the first device 304a and the protective layer 306c. The first etch is an isotropic non-selective etchant typically comprised of $NH_4OH$, $H_2O$, and $H_2O_2$. The first etch is used to define an opening or well region in the first device layer 304.

The second etch is a selective anisotropic etchant typically comprised of a solution of $H_2O_2$ and $NH_4OH$ having a PH in the range of 7.2 to 7.6 or a mixture of citric acid and $H_2O_2$. The second etch is used to etch a portion of the first device layer 304. The selective etchant etches the first device layer 304 and the protective GaAs lift-off layer 306c at a faster rate than the AlAs first layer 306a and the AlGaAs conformal layer 306b resulting in the overhang region 310 shown in FIG. 3B. The overhang 310 provides a shadowed structure which improves the accessibility of the etchant to the AlAs lift-off layer 306a after regrowth of the gallium arsenide in a subsequent processing step.

Figure 3C:
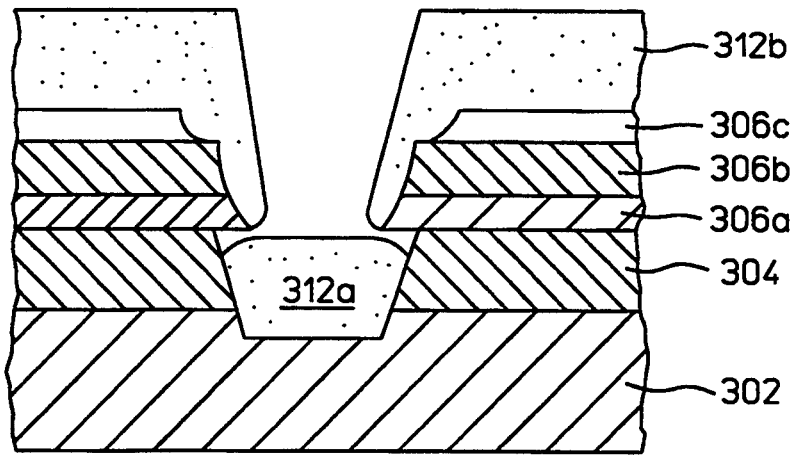

After formation of the overhang region 310, the second device layer 312 is formed resulting in the structure shown in FIG. 3C. The gallium arsenide layer 312a deposited in the well regions is monocrystalline and forms the second device region. The gallium arsenide layer 312b deposited over the GaAs protective layer 306c is also monocrystalline.

Figure 3D:
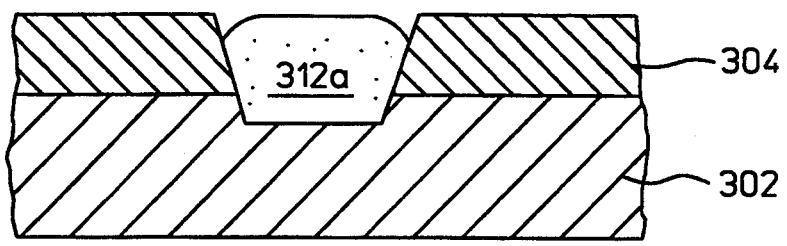

The next processing step is the selective removal of the lift-off layer 306a. The lift-off layer 306a is typically removed by immersing the sample in an aqueous solution 5–50% HF. Using this etch, AlAs can be etched at greater than $10^7$ times faster than GaAs so that the lift-off layer 306a is completely etched away while other layers are unetched. This allows layers 306b, 306c, and 312b to float away in solution leaving behind the structure depicted in FIG. 3D. As FIG. 3D shows, planar integration of the first and second device types has been achieved.

After the step of etching the lift-off layer 306a, the layers formed above The first and second device regions 304 and 310a typically float away in the etchant solution. Unfortunately, sometimes the layers formed above layers 304 and 310a do not float away but instead try to rebond to the substrate surface. To remove any products which stick to the surface, an adhesive material such as tape may be applied to the surface of the device structure.

Typically the adhesive surface is applied to a support structure for easy handling. An adhesive tape, such as blue tape manufactured by Nitto Corporation, is typically adhered to the support structure. To remove any products which have rebonded, the adhesive surface is placed so that the adhesive faces the material which has rebonded to the substrate surface. Any material which rebonds to the substrate surface adheres to the tape, thus leaving a clean surface as is shown in FIG. 3D.

The invention has now been described with reference to the specific embodiments. Other embodiments will be apparent to those skilled in the art. It is therefore not intended that this invention be limited, except as indicated in the appended claims.

What is claimed is:

1. A process for fabricating first and second coplanar semiconductor device regions on a substrate comprising the steps of:
   forming a first layer for formation of a first device region;
   depositing an epitaxial semiconductor lift-off layer above the first device region;
   removing a portion of the first device region to open areas for formation of the second device region;
   depositing a second layer for formation of a second device region; and
   removing the lift-off layer to leave first and second device regions remaining on the substrate.

2. The process recited in claim 1 where the first layer and the liftoff layer are formed in a single epitaxial growth chamber.

3. The process recited in claim 1 wherein the lift-off layer is comprised of at least a high etch rate layer whose etch rate is at least $10^5$ times the etch rate of the first and second regions when exposed to a first etchant.

4. The process recited in claim 3 wherein the first etchant is purged of oxygen.

5. The process recited in claim 1 wherein the lift-off layer is comprised of aluminum arsenide.

6. The process recited in claim 1 wherein the liftoff layer is comprised of aluminum gallium arsenide with an aluminum mole fraction greater than 0.6.

7. The process recited in claim 3 wherein the lift-off layer is further comprised of a protective layer.

8. The process recited in claim 7 wherein the protective layer is comprised of gallium arsenide.

9. The process recited in claim 1 wherein the lift-off layer is comprised of at least:
   a high etch rate layer whose etch rate with a first etchant is higher than the etch rate of the first and second device regions with the first etchant and further whose etch rate with a second etchant is slower than the etch rate of the first and second device regions with the first etchant; and
   a conformal layer whose etch rate with the second etchant is slower than the etch rate of the first and second device regions with the second etchant.

10. The process recited in claim 9 further comprising the step of applying a second etchant, wherein the step of applying a second etchant occurs after the removal of a portion of the active region of tile first device region.

11. The process recited in claim 10 wherein the step of applying a second etchant forms an overhang such that the sidewall of the high etch rate and the conformal layers extends past the sidewall of the portion removed from the first device region.

12. The process recited in claim 9 wherein the lift-off layer is further comprised of a protective layer.

13. The process recited in claim 1 further comprising tile step of applying an adhesive surface to the surface of the structure remaining after the step of removing the kilt-off layer.

* * * * *